United States Patent [19]

Pollack

[11] 3,940,319

[45] Feb. 24, 1976

[54] ELECTRODEPOSITION OF BRIGHT TIN-NICKEL ALLOY

[75] Inventor: Martin H. Pollack, Brooklyn, NY

[73] Assignee: NASGLO International Corporation, Flushing, N.Y.

[22] Filed: Nov. 1, 1974

[21] Appl. No.: 519,833

Related U.S. Application Data

[60] Division of Ser. No. 482,279, June 24, 1974, which is a continuation-in-part of Ser. No. 389,579, Aug. 20, 1973, abandoned.

[52] U.S. Cl. ............................................. 204/43 S
[51] Int. Cl.² ........................................... C25D 3/60
[58] Field of Search ....................... 204/43 S, 43 T

[56] References Cited
UNITED STATES PATENTS

| | | | |
|---|---|---|---|
| 3,002,901 | 10/1961 | Seyb | 204/43 S |
| 3,141,836 | 7/1964 | Seyb et al. | 204/43 S |

OTHER PUBLICATIONS

Abner Brenner, "Electrodeposition of Alloys", Vol. II, P. 317, (1963).

A. E. Davies et al., Trans. Institute Metal Finishing, pp. 227–240, Vol. 29, (1952–1953).

*Primary Examiner*—G. L. Kaplan
*Attorney, Agent, or Firm*—DeLio and Montgomery

[57] ABSTRACT

An alloy of 0.001–0.30 weight percent nickel, the balance being essentially tin. The alloy provides a brightness, smoothness, solderability and electrical conductivity comparable to gold and is electrodeposited from an aqueous bath containing nickel sulfate, nickel fluoborate, nickel sulfamate, stannous sulfate or stannous fluoborate, benzene sulfonic acid, sulfuric acid, fluoboric acid or sulfamic acid providing a pH not higher than 1, and a brightener. The concentration of the tin salt in the bath is at least about 1 oz./gal. and the weight ratio of the nickel salt to the tin salt is at least 0.20 to 1. Substrates which may be coated with the alloy include iron, nickel, silver and copper, alloys of copper, and aluminum or zinc coated with nickel, silver or copper, or any combinations thereof.

7 Claims, No Drawings

3,940,319

ELECTRODEPOSITION OF BRIGHT TIN-NICKEL ALLOY

BACKGROUND OF THE INVENTION

This application is a division of application Ser. No. 482,279 filed June 24, 1974 which in turn is a continuation-in-part of application Ser. No. 389,579, filed Aug. 20, 1973 and now abandoned.

This application relates to tin-nickel alloys, to aqueous electroplating baths capable of depositing such alloys on various metallic substrates, to a method of electrodepositing the tin-nickel alloy on such metallic substrates, and to the resulting tin-nickel alloy coated metallic substrates.

Gold and alloys of gold have long been favored as coatings on various metallic substrates, both electrically conducting and non-conducting, for the purpose of providing a durable, smooth and bright finish which together with the substrate material is easily soldered. Drastic recent increases in the price of gold have generated considerable interest in substitutes for gold or gold alloys and attention has been directed to tin-nickel alloys as candidates in view of the known durability of such alloys.

However, when it was attempted to electrodeposit on a metallic substrate a known tin-nickel alloy containing 65% tin and 35% nickel, it was found that the resulting article was deficient in many properties, expecially brightness, ductility, solderability, electrical conductivity and contact resistance. The electrical properties of the coating are highly critical when the tin-nickel plated article is to be utilized as a component of an electronic system, especially in aerospace electronics where high temperature stability is a serious consideration.

Commerical acceptance of an alloy also requires versatility of application. For example, duplex coatings are now widely used on metallic substrates to improve corrosion resistance and to act as barriers to diffusion of an underlying metal to the surface. Such duplex coatings include copper-nickel-chrome, copper-gold, tin plate over nickel or copper, gold over tin-nickel, and many other combinations. Examples of duplex coatings having barrier properties are copper under tin on brass components to prevent diffusion of zinc through the tin, and copper, or nickel under gold, on zinc die castings for the same reason. In addition, if the same alloy exhibits superior brightness, smoothness, and durability, it can also be used where electrical properties are not as important, such as in the electroplating of watch parts, surgical instruments, drawing instruments and balance weights. An alloy which also exhibits nonmagnetic properties is especially useful in the electroplating of watch parts.

From the standpoint of solderability, the tin-nickel alloy of U.S. Pat. No. 3,573,008 would seem to be an outstanding alloy for the applications discussed. However, it was found that even when the tin-nickel alloy of that patent, containing only 3% nickel, was electroplated on a metallic substrate, the electrical properties of the plated article were deficient in many respects. Nor did the plated article have the required brightness, even when the plating bath contained the ammonium bifluoride brightening agent recommended in the patent.

OBJECTS AND SUMMARY

Accordingly, an object of the invention is to provide a new and improved tin-nickel alloy having great versatility of application in the coating of metallic substrates for the electronic and other industries.

Another object is to provide a new and improved tin-nickel alloy, an electroplating bath and method of electroplating such alloy, for the efficient electroplating of metallic substrates, which electroplate exhibits brightness, durability, smoothness and has a beneficial effect on the electrical and soldering properties of the substrate material.

A further object is to provide an equal or superior substitute for gold as an electroplate on various metallic substrates in the manufacture of conducting and non-conducting articles.

These and other objects, features and advantages of the invention will be apparent from the specification which follows.

In summary outline, the foregoing objects are achieved by electrodepositing on a metallic substrate a tin-nickel alloy consisting essentially of 0.001–0.30 weight percent nickel and the balance tin. Alloys of this content when electrodeposited from highly acidic, aqueous electroplating baths also containing certain brightening agents, not only provide improved appearance to the substrate in terms of smoothness and brightness, but also introduce chemical and salt spray resistance, wearability and solderability.

It has been found that certain combinations of metal salts and electroplating conditions will give the foregoing results. The electrolytic salts which are effective are the sulfates, sulfamates and fluoborates of tin and nickel. With these salts must be used the corresponding acid, that is, benzene sulfonic acid, sulfuric acid, sulfamic acid or fluoboric acid, in amounts to provide a pH no higher than 1 in the aqueous bath from which the metals are to be deposited. The highly acidic pH enhances conductivity and permits the utilization of certain brightening agents which contribute to good throwing power and which would not otherwise be compatible in the bath. The highly acid condition also prevents hydrolysis of the tin salts.

Other conditions important for attaining the objects of the invention are the concentrations and relative amounts of the reactive ingredients in the electrolytic bath, and the selection of anodes for the electrodeposition. The bath must contain the tin salts at a concentration of at least about 1 oz./gal. and the weight ratio of the nickel salt to the tin salt must be at least 0.20 to 1. The upper limits on the concentrations of the salts relate to economy and solubility since over about 7 oz./gal., a tin salt tends to be insoluble.

The highly acidic condition of the bath requires careful selection of anodes to avoid acid corrosion or interference with electrodeposition due to other forms of attack on the anode, such as formation of a passivating film. It has been found that one or more nickel anodes or their equivalents provide the best results. Equivalent anodes include platinum or platinum-plated titanium.

The versatility of the alloys of the invention is perhaps most evident in that the alloys may be electrodeposited on a great variety of metallic substrates in order to enhance the properties of the substrates as finished articles of manufacture. For the purposes of this specification, "metallic substrate" means and includes a base material of a single metal, a base material of a single alloy, a base material which is formed of a non-metallic layer such as plastic, mineral fiber fabric or non-mineral fiber fabric coated with a metallic layer (a single metal or an alloy), or so-called "duplex" materials.

The latter usually comprise a single base metal such as zinc, which is first coated with a "barrier" metal (pure metal or alloy) and then top coated with another metal (pure or alloy). The barrier layer prevents diffusion of the base metal to the surface and often contributes to other desirable properties, such as solderability, smoothness, hardness, and the like. While normally the metallic substrate will be in a finished or semi-finished state of manufacture, such as electrical contacts, medical instruments or watch parts, the term is also intended to cover materials requiring additional processing steps to place them in finished form as articles of manufacture.

In its major aspects, the invention includes a novel aqueous electrolytic bath, a method of coating a metallic substrate with the alloy utilizing the electrolytic bath, and an article of manufacture comprising a metallic substrate coated with the novel alloy.

DETAILED DESCRIPTION

The electroplating bath of the invention is a highly acidic, aqueous solution containing stannous sulfate and nickel sulfate, or stannous fluoborate and nickel fluoborate, or stannous sulfate and nickel sulfamate, as the alloy generating constituents. The high acidity, of the order of pH 1 or lower, preferably pH 0.4 or less, is provided by a corresponding acid, that is, benzene sulfonic acid, sulfuric acid, fluoboric acid or sulfamic acid. While certain other mineral or organic acids will be useful, alone or in combination with the foregoing acids, to provide the requisite acidity, such other acids when utilized alone as the acidifying agent do not contribute as effectively as the foregoing acids to the solubility and compatibility of the metal generating salts and other ingredients and therefore no advantage is had by their utilization. Benzene sulfonic acid may also be used in admixture with sulfuric acid. Hydrochloric acid is to be avoided due to its highly corrosive action on the electrodes and electrodeposition apparatus, and the noxious character of its fumes.

The plating bath preferably is formulated to contain a brightening agent or agents. These agents not only enhance the brightness and color of the resulting alloy but also, when carefully selected, enhance the throwing power of the bath. The preferred brighteners for the sulfamate, sulfate or fluoborate baths are ketones, colloids, imidazolines and quaternary ammonium compounds.

The ketones include saturated and unsaturated aliphatic, cycloaliphatic, heterocyclic and aromatic ketones such as 1-benzoyl acetone, trans-4-phenyl-3-buten-2-one, catechol, and those described in U.S. Pat. No. 3,429,790, diones and complex ketones such as the imidazoline derivatives of Belgian Pat. No. 652,405. Colloidal brighteners include gelatin, alone or in combination with tannins, particularly when used with benzene sulfonic acid, and wood tars. Imidazolines include those of U.S. Pat. No. 3,575,826.

The quaternary ammonium compounds include N-benzyltrimethyl ammonium bromide or hydroxide, 1-hexadecyl pyridinium bromide, and benzyl hexadecyl dimethyl ammonium bromide.

The brightener may be present in the bath in an amount of about 0.0001 percent to about 1.0 percent by weight of the solution, depending upon the level of effectiveness of the brightener and its solubility. Solubility of the brightener and other ingredients as well as rate of solution can be controlled in routine fashion by the addition of dispersants known in the electroplating art, such as the lignin derivative sold under the brand name "Lignasol" by Lignasol Chemical Corporation, nonionics such as alkylphenol-alkylene oxide condensates, and ionics to the extent of compatibility with other ingredients of the plating bath.

Methods of forming the electrolytic baths of the invention are not critical. The usual precautions known in the electroplating art in connection with the handling of highly acid and reactive materials should be observed. One convenient mode of formulating the solutions is to dissolve each of the salts in a moderately acidic solution to form a concentrate, dilute the solution of the requisite strength, and then add the brightening agents, alone or in combination with suitable dispersants. The acidity of the solution may then be adjusted, usually by the addition of a concentrated acid. In some instances it may be preferable to separately dissolve only the tin salt in the acid solution and then add the acid solution of the tin salt to a solution of the other ingredients, in order to minimize any hydrolysis of the tin. The solutions or pre-mixed components thereof, may be agitated and/or heated somewhat to promote dissolving. Generally, temperatures above about 90°F. are unnecessary and should be avoided, particularly if it is inconvenient or uneconomical to cool the solution to the preferred temperature for electrodeposition. Acid may be metered to the bath during the electrodeposition process in order to maintain the requisite pH. A 50% acid solution is a suitable acid solution for this purpose.

The tin salt should be present in the aqueous solution at a concentration of at least about 1 oz./gal. The tin salt concentration may be higher but generally concentrations over about 7 oz./gal. are uneconomical. In the case of tin sulfate, considerable difficulty in solubilization is experienced over 7 oz./gal. The ratio of the nickel salt to the tin salt should be at least 0.20 to 1. The upper limit on the ratio is not important except from the standpoint of economy and solubility. A preferred weight ratio range is 0.25:1 to 1.75:1, nickel salt to tin salt. Representative concentrations providing this range are 4 oz./gal. $NiSO_4 \cdot 6H_2O$ and 1–7 oz./gal. $SnSO_4$.

The effective concentrations and proportions of metal salts are also related to the pH and the concentration of acid in the plating bath. For example, the more sulfuric acid present in the bath the more difficult it is to solubilize the higher concentrations of tin sulfate. Consequently, the results are best when the concentrations of salts are kept within the stated ranges.

Any apparatus conventional in the metal electroplating art may be employed in producing the metal alloys and metal coatings of the invention. Normally the metallic substrate upon which the alloy is to be electrodeposited will be the cathode. A plurality of substrates may be electroplated simultaneously, if desired. The anode should be nickel or an equivalent metal, that is, a metal which is not excessively attacked by the acid in the bath and which will not be oxidized or coated by ingredients of the bath so as to passivate the anode. For example, copper cannot be used as an anode metal because it is attacked by the highly acidic bath. Anodic materials equivalent to nickel are platinum or platinum-plated titanium. A plurality of anodes may be utilized, some of which may be tin anodes. Tin as an anodic material permits plating for only a short period of time without developing a resistive film and is normally to be avoided, at least as the sole anode metal.

Current densities and electrodeposition times are not critical and can vary widely depending upon other conditions of the process, such as temperature of the bath, the particular ingredients in the bath and their concentrations, and the thickness desired in the electrodeposited alloy. Generally, good results are achieved at room temperature and at current densities of about 10–30 amperes per square foot over about 5–30 minutes treating time. The temperature during the electrodeposition may range up to about 100°F. but there is no particular advantage in going above room temperature and some disadvantage for particular ingredients. For example, 100°F. should not be exceeded when tin sulfate is an ingredient of the bath since at about this temperature the stannous sulfate hydrolyses and stannous ion is oxidized to a higher valence state, leading to an insoluble sludge of stannic hydroxide. Agitation of the bath during preparation and plating, when the temperature rises above room temperature, helps to minimize formation of the sludge. The resulting deposits generally may range in thickness of from about 30 to 300 microinches and are clear, smooth, firmly adherent and silvery white in color.

Metallic substrates upon which alloys of the invention may be electrodeposited include single base metals such as iron, nickel, silver, surgical steel, aluminum, copper, alloys of copper and the like, and intermediate or top coatings in the formation of duplex coatings on certain substrates. For example, the alloy may replace the gold in the top coating in the case of nickel over zinc die castings. Other top coating replacements include replacement of the chrome in copper-nickel-chrome coatings, of the gold in nickel-gold coatings, and of the tin plating in tin plate-nickel or copper.

The invention also holds promise for restoring silver plating to its prior prominence. Silver plating in the electronic industry has substantially fallen out of use because of tarnishing and silver-migration. Although tarnishing was mitigated somewhat by electrolytic alkaline chromate treatment and by the application of organic materials for improving the resistance of silver to tarnishing, it was found that when silver connectors treated in this manner were mated or soft-soldered the protection was destroyed. It has now been discovered that by over-coating silver-plated electronic components, before tarnishing and silver migration set in, such effects are eliminated completely. A coating of about 50 millionths of an inch of the tin-nickel alloy of the invention will provide this result.

The tin-nickel alloy of the invention also provides a highly advantageous substitute for conventional nickel plating utilized in the electronic industry as a protective finish. Conventional nickel plating has two shortcomings. First, the contact resistance of nickel is high. Secondly, when nickel-plated electronic components require the application of soft solder for connecting wires or for joining to other components, non-corrosive rosin flux.

The following Examples are intended as further illustrations of the invention but are not necessarily limitative except as set forth in the claims. All parts and percentages are by weight unless otherwise indicated.

EXAMPLE 1

In a suitable plating vessel equipped with mechanical stirrer, an aqueous plating bath was prepared having the following formulation:

| | |
|---|---|
| stannous sulfate | 50 grams per liter |
| nickel sulfate | |
| ($NiSO_4 \cdot 6H_2O$) | 10 grams per liter |
| benzene sulfonic acid | 100 grams per liter |
| gelatin | 2 grams per liter |
| tannin | 2 grams per liter |

After mechanical mixing for one hour at about 20°–40°C., the solution was allowed to cool to room temperature and one nickel anode and one tin anode were immersed therein. Brass plates which had previously been alkaline-cleaned, bright-dipped in a sulfuric-nitric acid solution and well rinsed, were then also immersed in the solution as cathodes. The electrodes were then suitably connected to a power supply. The current density ranged between 20 and 30 amperes per square foot. After 5, 10, 20 and 30 minute intervals, the brass plates were removed from the bath and inspected. It was determined that the brass plates had become plated with a tin-nickel alloy containing about 0.1 and 0.3% nickel and the balance tin to depths of about 30–300 microinches depending on the duration of plating. The electrodeposited coatings were clear, smooth, firmly adherent and silvery white in color. The pH of the plating bath was under 0.4.

Certain of the electroplated coatings had a Knoop hardness of 18.0 and 19.0 (as compared with about 22 for tin) and a melting point of 424°F. (as compared with 449°F. for bright tin electroplate). The contact resistance of the alloy relative to gold was measured by comparing contacts electroplated with 20 millionths of an inch gold with the same contacts plated with 100 millionths of an inch of the new tin-nickel alloy. At a current of 1 ampere, the gold-plated contacts showed a millivolt drop of 2.4 to 2.8 whereas the tin-nickel alloy plate showed a millivolt drop of 2.2 to 2.6. The contact resistance after a 500 cycle wear test indicated an average increase of 0.29 millivolts for the tin-nickel alloy as compared with an average increase of 0.41 millivolts for the gold plated contacts. The contact resistance after 48 hours of salt spray testing increased on an average of 0.30 millivolts for the tin-nickel alloy as compared with 0.40 millivolts for the gold plated contacts.

It was concluded that the new tin-nickel alloy provided the same or better electrical properties as compared with gold and therefore was a highly practical substitute for gold as a coating for electronic components.

EXAMPLE 2

Substantially as described in Example 1 an aqueous elecroplating bath was prepared having the following formulation:

| | |
|---|---|
| stannous sulfate | 50 grams per liter |
| nickel sulfate | |
| ($NiSO_4 \cdot 6H_2O$) | 10 grams per liter |
| sulfuric acid (98%) | 100 grams per liter |
| N-benzyltrimethyl | |

| ammonium bromide | 5 grams per liter |

As the result of electroplating substantially as described in Example 1, brass plates were shown to be coated with firmly adherent tin-nickel alloy deposits having a bright white and smooth appearance, and a nickel content of about 0.2 and 0.3 percent, with the balance tin. Optimum deposits were obtained at a current density between 15 and 30 amperes per square foot and at a temperature of 20°–40°C.

EXAMPLE 3

Substantially as described in Example 1 an aqueous electroplating bath was prepared having the following formulation:

| tin fluoborate | 100 grams per liter |
| nickel fluoborate | 20 grams per liter |
| fluoboric acid | 100 grams per liter |
| gelatin | 2 grams per liter |
| N-benzyltrimethyl ammonium hydroxide | 1 gram per liter |

Under substantially the same electroplating conditions as described in Example 1, smooth, bright, white and firmly adherent deposits of a tin-nickel alloy containing about 0.1% nickel, the balance tin, were obtained. Above about 25 amperes per square foot current density, however, the deposit evidenced high porosity and low coverage on a bent cathode.

EXAMPLE 4

In the manner indicated below, an aqueous electroplating bath was prepared having the following formulation:

| stannous sulfate | 50 grams per liter |
| nickel sulfamate | 50 grams per liter |
| sulfamic acid | 100 grams per liter |
| N-benzyltrimethyl ammonium bromide | 5 grams per liter |
| 1-benzoyl acetone | 1 gram per liter |

Specifically, the plating solution was prepared by dissolving the metal salts in 900 ml. of 100 g./l. sulfamic acid. The organic components were dissolved in 100 ml. of the 100 g./l. sulfamic acid solution and the resulting solution was added to the first solution.

Plating was carried out under substantially the same conditions as indicated in Example 1 except that the effects of varying the current density from 5 to 100 amperes per square foot were studied. It was determined that at a current density of 5–50 amperes per square foot the current efficiency was 90 ± 5 percent and that movement of the cathode permitted higher current densities without burning as well as uniform corrosion of tin and nickel anodes without passivation, even up to a current density of 100 amperes per square foot. The alloy contained about 0.007% nickel, the balance tin.

OTHER EXPERIMENTS

Generally, with respect to most of the experiments and formulations, the N-benzyltrimethyl ammonium bromide appeared to have a retarding action on the oxidation of the stannous salts. For optimum results it was determined that the anode area should be about twice the cathode area and the anode current density should be kept below about 25 amperes per square foot in order to prevent passivation of the tin anodes. Also, current densities above 25 amperes per square foot tend to increase the brittleness of the electrodeposited coating whereas deposits produced below 25 amperes per square foot were generally quite ductile. Levels of porosity of the deposits were minimum under these conditions, and leveling and throwing power of the baths were excellent.

Above pH 1 the current efficiency falls radically. The optimum temperature is about room temperature to about 30°C. At a temperature higher than 50°C. the current efficiency falls, probably due to oxidation of stannous salts to stannate.

It is believed that the acids in the plating baths may be used singly or in admixture.

In view of the foregoing description it will be apparent that the invention is not limited to the specific details set forth therein for the purposes of illustration, and that various other modifications are equivalent for the stated and illustrated functions without departing from the spirit and scope of the invention.

What is claimed is:

1. An aqueous electroplating bath capable of depositing an alloy consisting essentially of 0.001–0.30 wt. % nickel and the balance tin, said bath consisting essentially of (a) a nickel salt selected from nickel sulfate, nickel fluoborate and nickel sulfamate, (b) a corresponding tin salt, (c) sulfuric acid, sulfamic acid, benzene sulfonic acid or fluoboric acid in an amount providing a pH of not higher than 1, and (d) an effective amount of a brightening agent, wherein the concentration of said tin salt is at least about 1 oz./gal. and the weight ratio of said nickel salt to said tin salt is at least 0.20 to 1.

2. A bath as in claim 1 wherein the nickel salt is nickel sulfate, the tin salt is stannous sulfate, the acid is sulfuric acid, the brightener is N-benzyltrimethyl ammonium bromide or hydroxide, and the concentration of the stannous sulfate is about 1–7 oz./gal.

3. A bath as in claim 1 wherein the nickel salt is nickel fluoborate, the tin salt is stannous fluoborate, the acid is fluoboric acid, the brightener is N-benzyltrimethyl ammonium bromide or hydroxide, and the concentration of the stannous fluoborate is about 1–7 oz./gal.

4. A method of coating a metallic substrate so as to provide the properties of a gold coating thereon but without utilizing gold, which comprises electrolytically contacting the said substrate with the electroplating bath of claim 1.

5. A method as in claim 4 wherein an anode is utilized consisting essentially of nickel, platinum or platinum-plated titanium.

6. A method of coating a metallic substrate so as to provide the properties of a gold coating thereon but without utilizing gold, which comprises electrolytically contacting the said substrate with the electroplating bath of claim 2.

7. A method of coating a metallic substrate so as to provide the properties of a gold coating thereon but without utilizing gold, which comprises electrolytically contacting the said substrate with the electroplating bath of claim 3.

* * * * *